United States Patent [19]
Pauli et al.

[11] Patent Number: 5,884,211
[45] Date of Patent: Mar. 16, 1999

[54] SYSTEM AND METHOD FOR MEMORY RESET OF A VEHICLE CONTROLLER

[75] Inventors: Allen Joseph Pauli, Macomb Township; Thomas Robert Melville, Northville; Kathleen Arlow Grant, Farmington Hills; David Harold Schmitt, White Lake, all of Mich.

[73] Assignee: Ford Global Technologies, Inc., Dearborn, Mich.

[21] Appl. No.: 786,941

[22] Filed: Jan. 23, 1997

[51] Int. Cl.[6] .................................................. F02D 41/00
[52] U.S. Cl. ............................................................ 701/115
[58] Field of Search ........................ 701/115; 364/431.12, 364/569; 315/77

[56] References Cited

U.S. PATENT DOCUMENTS

| | | | |
|---|---|---|---|
| Re. 31,997 | 10/1985 | Klotzner | 364/431.12 |
| 4,348,729 | 9/1982 | Sasayama et al. | 364/431.12 |
| 4,402,057 | 8/1983 | Itou et al. | |
| 4,408,296 | 10/1983 | Robbi et al. | 701/115 |
| 4,562,545 | 12/1985 | Hasegawa | 364/550 |
| 4,575,809 | 3/1986 | Sinniger et al. | 364/569 |
| 5,200,900 | 4/1993 | Adrian et al. | 364/431.12 |
| 5,670,845 | 9/1997 | Grant et al. | 315/77 |

FOREIGN PATENT DOCUMENTS

| | | |
|---|---|---|
| 0 563 997 A1 | 2/1993 | European Pat. Off. |
| WO 92/19046 | 4/1991 | WIPO |

*Primary Examiner*—Raymond A. Nelli
*Attorney, Agent, or Firm*—Peter Abolins; Roger L. May

[57] ABSTRACT

A system and method for resetting a portion of memory in a vehicle controller include repeatedly comparing data stored in at least one validation address with corresponding data stored in a non-volatile data storage device, transferring data representing nominal control parameter values from the non-volatile storage device to the portion of memory in response to a discrepancy between the data stored in the validation address and the corresponding data stored in the non-volatile data storage device, and modifying data stored in at least one validation address based on a request received via a communication port to generate discrepancy. A memory reset function is provided while limiting access by service technicians to modify values stored in memory and eliminating the need to disconnect the vehicle battery to remove power from the system. As such, other vehicle accessories are not affected by the reset function.

16 Claims, 2 Drawing Sheets

SYSTEM AND METHOD FOR MEMORY RESET OF A VEHICLE CONTROLLER

TECHNICAL FIELD

The present invention relates to a system and method for resetting a portion of the memory in a vehicle controller.

BACKGROUND ART

Microprocessor control has afforded many advantages to many applications, particularly vehicle control. As microprocessors continue to become more sophisticated, additional features may be added to enhance control of the vehicle. In addition, an increasing number of vehicle accessories are controlled by microprocessors to customize the vehicle environment for one or more occupants. For example, power seats, power mirrors, stereo systems, and the like, may be controlled by microprocessors and include memory to store preferences for one or more users, such as radio station presets, or seat or mirror positions.

Microprocessor-based controllers are often given generic names to describe their function. For example, an engine control module (ECM) is used to control the engine, a transmission control module (TCM) is used to control an automatic transmission, and anti-lock braking system (ABS) controller may be used to control the vehicle brakes. As controllers become more sophisticated, various functions may be combined or integrated into a single controller. For example, a powertrain control module (PCM) may be used to control the engine and transmission. Similarly, a vehicle control module (VCM) may be used to control the engine, transmission, active suspension, power steering, ABS, and the like. The various controllers use permanent/non-volatile and temporary/volatile memory to store control parameter values and control logic to effect control over the various systems. Many systems now use adaptive control parameters which change over time to respond to changing system dynamics. For example, engine idle speed control (ISC) or fuel control parameters may be used to implement an adaptive control strategy to adjust for changes which occur due to wear of various engine components. Adaptive control parameters may be used in an active suspension system to adjust for the change in frequency response of the suspension components or to adapt to a particular vehicle loading. An automatic transmission may use adaptive control parameters to maintain consistent shift quality as various friction components wear or transmission fluid characteristics change.

In addition to adaptive control parameters, real-time controllers continually calculate and update variables based on the current operating conditions of the vehicle. These variables are typically stored in temporary memory such as RAM. As such, when the vehicle ignition is turned off, the values of these variables are lost. In contrast, it is often desirable to maintain the values for adaptive control parameters from one engine start to the next because they are typically slowly varying parameters which are set to a nominal value during manufacturing and then adjusted over the life of the vehicle. As such, these types of variables are often stored in a more permanent type of memory, generically referred to as keep-alive memory. The keep-alive memory allows modification of the parameter values and is not generally reset when the engine is stopped and the ignition key turned off.

A number of control parameter values which should not be modified are also determined by the manufacturer. For example, certain parameters affecting fuel economy, engine power, and exhaust emissions should not be modified by vehicle customers. These values, along with the control logic which executes the various control functions, are stored in permanent memory, such as ROM. Permanent memory may not be modified without replacing the physical IC chip (or reprogramming in the case of flash memory) and does not require any type of power to maintain its contents.

A service tool is often used during the process of diagnosing and repairing various vehicle components. The service tool typically includes a microprocessor which communicates with one or more microprocessors of the various vehicle controllers to aid in diagnosis and repair. Certain procedures used for diagnosis and repair require the servicing technician to reset one or more control parameter values stored in the keep-alive memory. For example, replacement of a component which affects the idle speed control or fuel control may require resetting of the adaptive control parameter values to their nominal settings. The current method for resetting keep-alive memory requires the removal of one or both of the battery cables to remove all power from the vehicle systems. The technician must wait a number of minutes to assure that any capacitive charge has been dissipated to allow the keep-alive memory to be cleared. However, this often results in the undesired loss of several other variables in various other vehicle systems and accessories, such as radio presets, seat positions, and the like.

Engineers may use a development tool to monitor and change various control parameters and control logic of the vehicle controller. This equipment is also used during development to select nominal values for various calibrations which may affect operation of the systems. Such equipment provides essentially unfettered access to all of the vehicle control parameters. As such, engineers could use this equipment to modify one or more variables which are stored in the temporary memory, or keep-alive memory. However, this requires detailed knowledge of the variable names and/or locations and their effect on vehicle operation. It is impractical and undesirable to provide such unfettered access to the general public or even to qualified service technicians due to the possibility of unauthorized and potentially dangerous modifications to the vehicle control. As such, it is desirable to provide a method of clearing or resetting only those control parameter values which are necessary to effect diagnosis or repair of a particular system or subsystem.

SUMMARY OF THE INVENTION

It is an object of the present invention to provide a system and method for resetting a portion of memory having stored control parameter values without removing power from the system.

It is a further object of the present invention to provide a system and method for resetting at least a portion of memory having stored control parameter values while limiting access to the entire memory.

In carrying out the above objects and other objects and features of the present invention, a method is provided for resetting keep-alive memory in a vehicle controller having a processor in communication with the keep-alive memory and a non-volatile memory. The vehicle controller includes a communication port controlled by the processor for transferring information. The method includes receiving a request to reset at least a portion of the keep-alive memory and modifying data stored within the portion of the keep-alive memory to induce a fault condition which resets the keep-alive memory. A status message indicating whether or not the request was completed may also be provided. Once the fault condition is induced, data representing nominal values are transferred from non-volatile memory to the portion of the keep-alive memory to reset the keep-alive memory.

A method is also provided for resetting a portion of memory having stored adaptive engine control parameter values and at least one validation address in an engine controller which includes a processor in communication with the memory and with a non-volatile data storage device having stored nominal engine control parameter values. The engine controller includes a communication port controlled by the processor for transferring data to and from the engine controller to effect control of the engine. In this embodiment, the method includes repeatedly comparing data stored in the validation addresses with corresponding data stored in the non-volatile data storage device. If a discrepancy between the data stored in the validation addresses and the data stored in the non-volatile data storage device is detected, data representing the nominal engine control parameter values are transferred from the non-volatile storage device to the portion of memory to reset the memory. Data stored in at least one of the validation addresses is intentionally modified based on a request received via the communication port to generate the discrepancy.

The advantages accruing to the present invention are numerous. For example, the present invention allows a service technician to perform various diagnostic and repair procedures without removing battery cables. In addition, the present invention allows resetting of one or more memory locations without affecting other vehicle functions which are dependent upon the vehicle power supply, such as the clock, radio, seat, suspension, driver profile, and the like. As such, the service technician is no longer required to reprogram the various electronic accessories in the vehicle. Furthermore, the customer is not inconvenienced by having to readjust each of these accessories. Also, this eliminates any remote possibility of sparking which occurs when a battery cable is disconnected and reconnected.

The above objects and other objects, features, and advantages of the present invention are readily apparent from the following detailed description of the best mode for carrying out the invention when taken in connection with the accompanying drawings.

BEST MODE(S) FOR CARRYING OUT THE INVENTION

Figure 1:
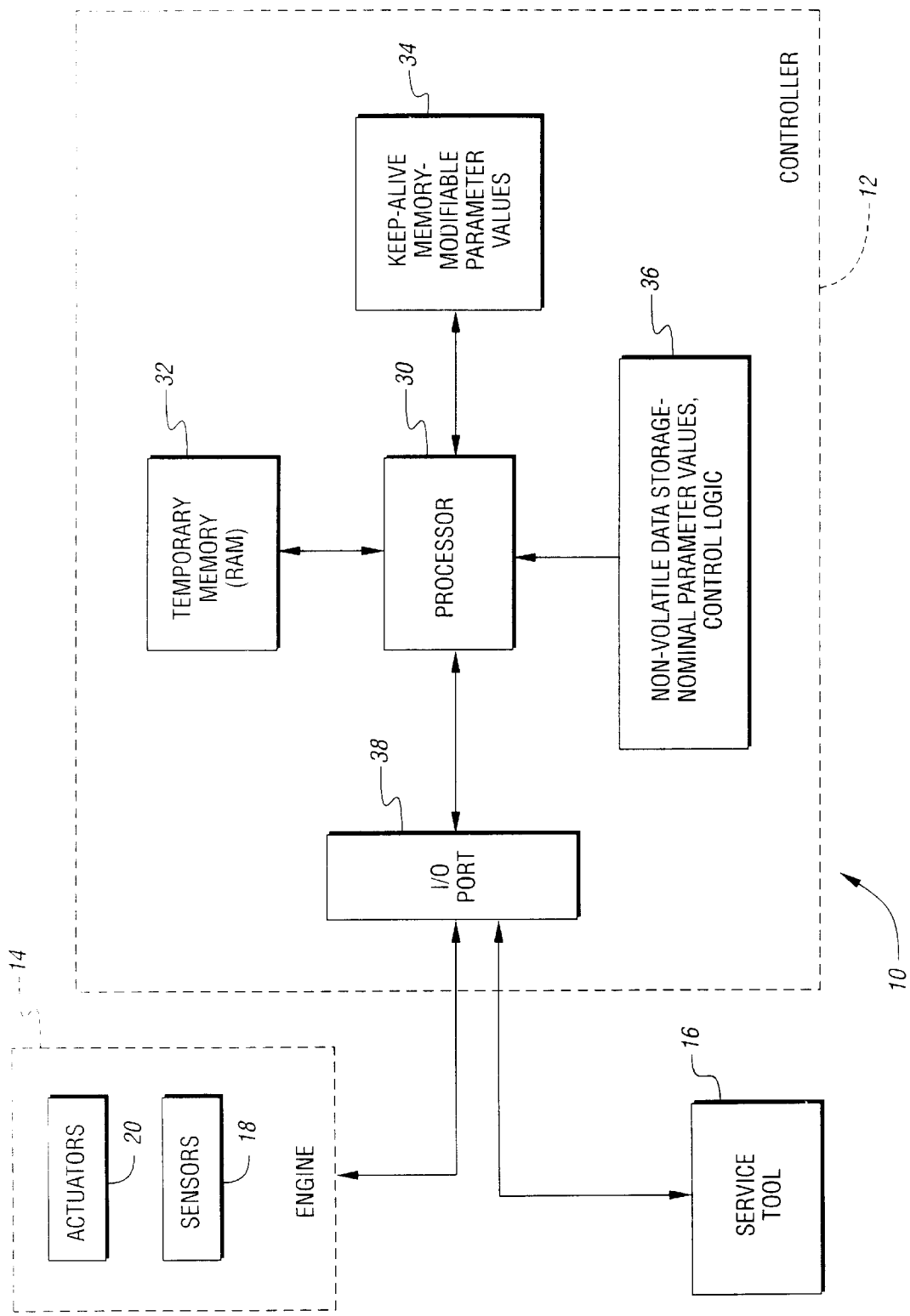
FIG. 1 is a block diagram illustrating a system for resetting a portion of memory according to the present invention.

Referring now to FIG. 1, a block diagram illustrating a system for resetting a portion of memory of a control unit according to the present invention is shown. The system 10 includes a controller, indicated generally by reference numeral 12, in communication with one or more vehicle systems or subsystems, such as an engine, indicated generally by reference numeral 14. Engine 14 includes various sensors 18 and actuators 20 which are used to effect control of engine 14 by controller 12. Service tool 16 is connectable to controller 12 via plug 40 for diagnostic and repair procedures.

Controller 12 represents any microprocessor-based controller having a microprocessor 30 in communication with various types of memory such as a temporary memory 32, a keep-alive memory 34, and a non-volatile data storage device 36. As such, controller 12 may be used to control other vehicle systems such as the transmission, suspension, steering, brakes, and the like. Controller 12 also includes a communications port 38 which is controlled by processor 30 to transfer data to and from controller 12 to effect control of one or more vehicle systems, such as engine 14. Communication (I/O) port 38 is also used to communicate diagnostic and repair information to service tool 16 when connected via plug 40.

In operation, non-volatile data storage device 36 is loaded with nominal control parameter values and control logic during manufacturing to effect control of the various vehicle systems and subsystems, such as engine 14. The data stored in non-volatile data storage 36 cannot be changed after manufacturing. In a preferred embodiment, data storage device 36 is implemented via a read-only memory (ROM). Of course, other types of memory or permanent data storage devices may be used as well. Similarly, the stored control logic may be implemented via software instructions executed by processor 30 or via hardware circuitry depending upon the particular application. In a preferred embodiment, control logic is implemented by both hardware and software.

Keep-alive memory 34 is used to store modifiable parameter values such as those which may be used for adaptive control functions. Parameter values stored in keep-alive memory 34 are maintained from one engine start to the next. Keep-alive memory 34 may be implemented using any of a variety of readable and writable media, such as RAM, EEPROM, or the like.

Temporary memory 32 is used to store working variables which are initialized for each engine start. Processor 30 executes program instructions to implement control logic and communicates signals via I/O port 38 to actuators 20 of engine 14. Similarly, sensors 18 provide signals through I/O port 38 to processor 30 to indicate the current operating conditions of engine 14. Service tool 16 communicates with processor 30 through communications port 38 to perform various diagnostic and repair functions.

Figure 2:
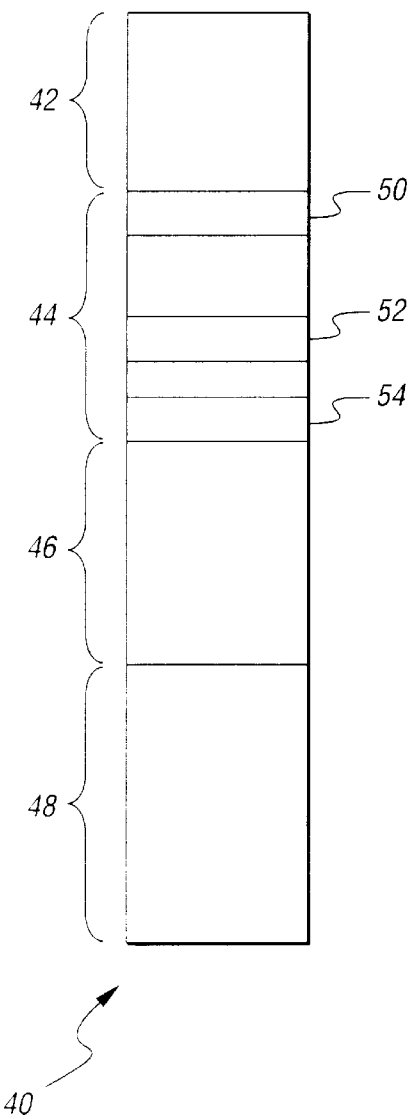
FIG. 2 illustrates a logical memory map for a system such as illustrated in FIG. 1.

Referring now to FIG. 2, a representation of a logical memory map is shown to illustrate the system and method for resetting memory according to the present invention. Memory map 40 includes various logical sections identified by corresponding addresses. The logical sections 42, 44, 46, and 48 may be implemented by a single physical device but are preferably implemented by multiple physical devices. For example, addresses represented by portion 42 may correspond to a physical device such as non-volatile storage device 36 whereas addresses corresponding to section 44 may correspond to keep-alive memory, such as keep-alive memory 34. Likewise, addresses represented by portion 46 may correspond to a temporary memory such as RAM 32, while addresses represented by section 48 may correspond to a mirror image of non-volatile memory which allows modification. Logical memory map 40 preferably includes validation or qualification addresses 50, 52, and 54. Validation or qualification addresses 50, 52, and 54 are preferably spaced throughout memory to provide error detection. These addresses may contain a checksum or other validation code which is used to verify the integrity of the memory contents. This also makes it difficult for unauthorized users to tamper with the control parameters because changing contents of certain memory locations will result in an improper validation or checksum causing a system error or fault.

One or more of the various portions or sections 42, 44, 46, and 48 of logical memory 40 may be implemented in a single device. For example, section 44 and section 46 representing addresses of keep-alive memory and RAM, respectively, may be implemented by a single memory chip (IC). Validation or qualification addresses 50, 52, and 54 may be present at various locations throughout logical memory 40 and within various physical memory devices. Similarly, a validation address such as validation address So located within portion 44 of logical memory 40 may be used for validation or qualification of a different section, such as section 46 or 48.

In a preferred embodiment, keep-alive memory includes three validation addresses. When the system is first initialized, a validation or qualification pattern (data) is copied from non-volatile data storage device as represented by section 42 into each of the at least one validation addresses. During operation, the data stored at the validation addresses are compared to corresponding data in the non-volatile memory. Any discrepancy results in a memory reset as explained in greater detail below.

In a preferred embodiment, a first validation address 50 includes a pattern which checks all bits. Validation address 52 includes a pattern which checks all odd bits and validation address 54 includes a pattern which checks all even bits. For example, in a four-bit system, validation address 50 would be loaded with "111", validation address 52 would be loaded with "1010", and validation address 54 would be loaded with "0101". Of course, other validation codes or data may be used without departing from the spirit or scope of the present invention.

Figure 3:
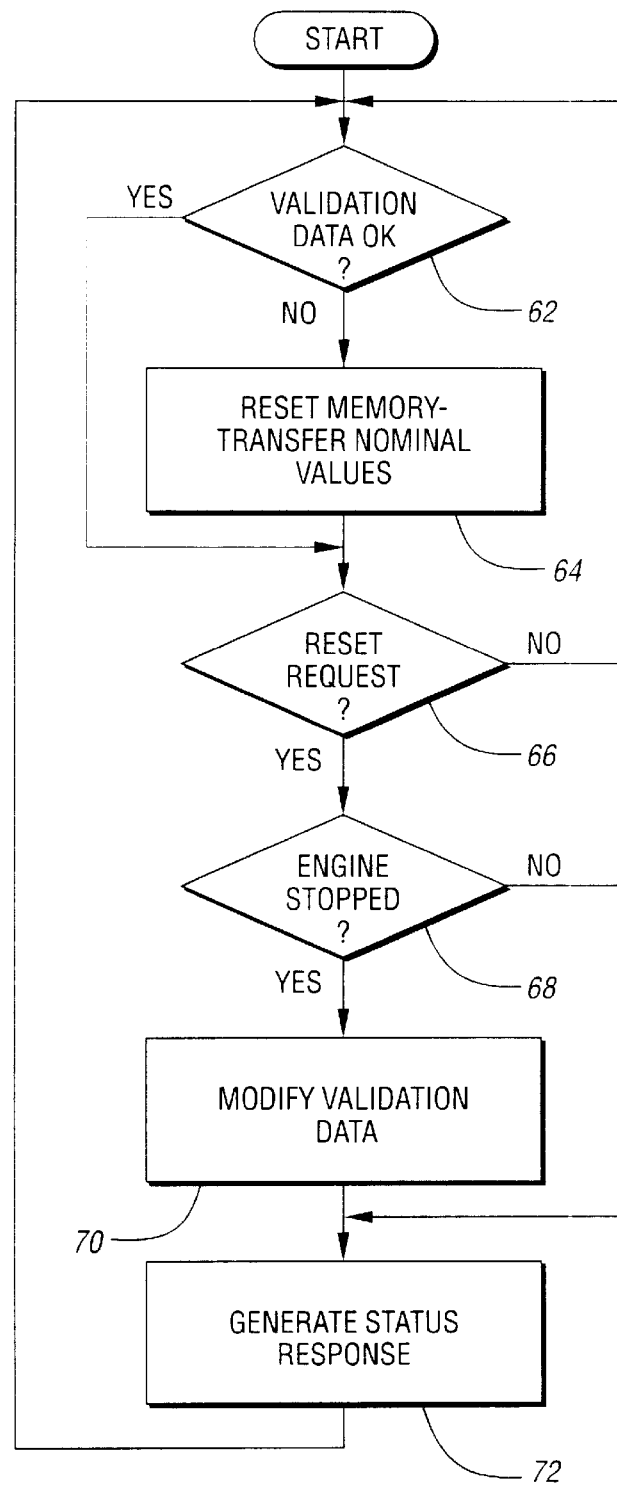
FIG. 3 is a flow diagram illustrating operation of a system and method for resetting memory according to the present invention.

Referring now to FIG. 3, a flow diagram illustrating operation of the system and method for resetting memory in a vehicle controller according to the present invention is shown. While the operation is illustrated in a number of sequentially performed steps, one of ordinary skill in the art will recognize that other forms of processing may be utilized in accordance with the present invention. As such, various steps may be performed in a different order or simultaneously rather than in the particular manner shown. In a preferred embodiment, flow diagram 60 represents various steps or functions performed by software executed by a microprocessor. Similar steps or functions may also be performed by a dedicated electronic circuit or a combination of such hardware and software.

Flow diagram 60 represents only a portion of the control logic required to effect control of a vehicle system or subsystem. As illustrated, the various steps may be repeatedly performed subject to various levels of interrupts. Block 52 represents a test to determine whether the validation data stored at one or more validation addresses match corresponding data stored in non-volatile memory or a non-volatile data storage device. If a discrepancy is detected between the data stored in one of the validation addresses and the corresponding data stored in a non-volatile data storage device, the memory is reset as indicated by block 64. A memory reset may be implemented by transferring data representing the nominal control parameters values from the non-volatile storage device to the portion of memory corresponding to the validation address, i.e. section 44 in FIG. 2. Alternatively, a memory reset may transfer a single value, such as "0" to all of the locations to "clear" the memory. As described above, the portion of memory which corresponds to a particular validation address may be located in the same physical memory chip or in a different memory chip. Similarly, the memory addresses corresponding to the validation addresses may be only a portion of any particular physical memory chip.

If the data located in all validation addresses match the data stored in the corresponding non-volatile memory, control passes to block 66 which determines whether a reset request has been received. In a preferred embodiment, a reset request is generated by a service tool which is connected to perform diagnostic or repair procedures. If a reset request is not received as indicated by block 66, control returns back to block 62.

When a reset request is received, as indicated by block 66, block 68 determines whether the engine is stopped. In a preferred embodiment, a memory reset is performed only if the engine is stopped, i.e. the ignition key is in the "on" position, but the engine has stopped. If a reset request is received with the engine running, control is passed to block 72 which generates an appropriate status response indicating that the reset request cannot be completed. If the engine is stopped and a reset request is received, as indicated by blocks 68 and 66, respectively, data located in at least one validation address are modified, as indicated by block 70. This induces a fault condition the next time that the validation data are checked, as represented by block 62, which causes a reset of the corresponding portion of memory as described above.

In a preferred embodiment, a memory reset request is a menu-selectable option on a connectable service tool. This allows a service technician to reset a portion of the memory by modifying only a single memory location. As such, memory access is limited because the service tool does not allow changing of values for other unauthorized memory locations. Rather, by modifying a qualification or validation address, the software of the controller automatically resets the corresponding area or tables in memory. As such, the technician is not required to remove power from the controller so various other vehicle systems and accessories are not affected. To further restrict access to the memory reset function, a password may be required to complete the reset request.

While the best modes for carrying out the invention have been described in detail, those familiar with the art to which this invention relates will recognize various alternative designs and embodiments for practicing the invention as defined by the following claims.

What is claimed is:

1. A method for resetting keep-alive memory in a vehicle controller having a processor in communication with the keep-alive memory and a non-volatile memory, the controller also including a communication port controlled by the processor for transferring information, the method comprising:

receiving a request to reset at least a portion of the keep-alive memory;

modifying data stored within the portion of the keep-alive memory to induce a fault condition which causes a reset of the keep-alive memory.

2. The method of claim 1 further comprising generating a status message in response to the request to reset at least a portion of the keep-alive memory.

3. The method of claim 1 wherein the step of modifying comprises transferring data from the non-volatile memory to the portion of the keep-alive memory to reset the keep-alive memory.

4. The method of claim 1 wherein the step of modifying comprises modifying only one address within the portion of keep-alive memory to induce the fault condition.

5. The method of claim 1 wherein the step of modifying comprises:

comparing data from at least one address of the keep-alive memory with data from the non-volatile memory; and transferring data from the non-volatile memory to the portion of keep alive memory to reset the portion of keep alive memory when the step of comparing indicates disparity between the data compared.

6. A method for resetting a portion of memory having stored adaptive engine control parameter values and at least one validation address in an engine controller which includes a processor in communication with the memory and with a non-volatile data storage device having stored nominal engine control parameter values, the engine controller also including a communication port controlled by the processor for transferring data to and from the engine controller to effect control of an engine, the method comprising:

repeatedly comparing data stored in the at least one validation address with corresponding data of the non-volatile data storage device;

transferring data representing the nominal engine control parameters from the non-volatile storage device to the portion of memory in response to a discrepancy between the data stored in the at least one validation address and the corresponding data stored in the non-volatile data storage device; and modifying data stored in at least one of the at least one validation address based on a request received via the communication port to generate the discrepancy so as to reset the portion of memory.

7. The method of claim 6 further comprising:

determining whether the engine is stopped; and performing the step of modifying only after the step of determining indicates the engine is stopped.

8. The method of claim 6 wherein the step of modifying is performed only after entry of a predetermined password.

9. The method of claim 6 wherein the step of transferring comprises transferring the corresponding data from the non-volatile data storage device to the at least one validation address of the portion of memory.

10. A system for resetting a portion of memory of a control unit for a motor vehicle having stored modifiable parameter values and at least one validation address, the system comprising:

a non-volatile data storage device having stored nominal parameter values; and control logic in communication with the non-volatile data storage device and the memory of the control unit;

wherein the control logic repeatedly compares data stored at the at least one validation address with corresponding data of the non-volatile data storage device, transfers data representing the nominal parameter values from the non-volatile data storage device to the portion of memory in response to a discrepancy between the data stored in the at least one validation address and the corresponding data stored in the non-volatile data storage device, and modifies data stored in at least one of the at least one validation address in response to a reset request to generate the discrepancy so as to reset the portion of memory.

11. The system of claim 10 further comprising a service tool connectable to the control unit for generating the reset request in response to a request from a user.

12. A computer readable storage medium having stored therein instructions executable by a computer to reset keep-alive memory in a vehicle controller, the computer readable storage medium comprising:

instructions for receiving a request to reset at least a portion of the keep-alive memory;

instructions for modifying data stored within the portion of the keep-alive memory to induce a fault condition which causes a reset of the keep-alive memory.

13. The computer readable storage medium of claim 12 further comprising instructions for generating a status message in response to the request to reset at least a portion of the keep-alive memory.

14. The computer readable storage medium of claim 12 wherein the instructions for modifying comprise instructions for transferring data from the non-volatile memory to the portion of the keep-alive memory to reset the keep-alive memory.

15. The computer readable storage medium of claim 12 wherein the instructions for modifying comprise instructions for modifying only one address within the portion of keep-alive memory to induce the fault condition.

16. The computer readable storage medium of claim 12 wherein the instructions for modifying comprise:

instructions for comparing data from at least one address of the keep-alive memory with data from the non-volatile memory; and instructions for transferring data from the non-volatile memory to the portion of keep alive memory to reset the portion of keep alive memory when the step of comparing indicates disparity between the data compared.

* * * * *